(12) United States Patent
Van Herpen et al.

(10) Patent No.: US 7,875,863 B2
(45) Date of Patent: Jan. 25, 2011

(54) ILLUMINATION SYSTEM, LITHOGRAPHIC APPARATUS, MIRROR, METHOD OF REMOVING CONTAMINATION FROM A MIRROR AND DEVICE MANUFACTURING METHOD

(75) Inventors: Maarten Marinus Johannes Wilhelmus Van Herpen, Heesch (NL); Vadim Yevgenyevich Banine, Helmond (NL); Mandeep Singh, Delft (NL); Harm-Jan Voorma, Zaltbommel (NL); Derk Jan Wilfred Klunder, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 704 days.

(21) Appl. No.: 11/643,951

(22) Filed: Dec. 22, 2006

(65) Prior Publication Data

US 2008/0149854 A1      Jun. 26, 2008

(51) Int. Cl.
*G21G 5/00* (2006.01)
(52) U.S. Cl. .................... 250/492.2; 250/492.1
(58) Field of Classification Search .......... 250/492.1, 250/492.2, 492.21, 492.22, 492.3, 504 R
See application file for complete search history.

(56) References Cited

U.S. PATENT DOCUMENTS

| | | | |
|---|---|---|---|
| 2003/0147058 A1* | 8/2003 | Murakami et al. | 355/53 |
| 2006/0131515 A1* | 6/2006 | Partlo et al. | 250/504 R |
| 2006/0163500 A1* | 7/2006 | Inoue et al. | 250/493.1 |
| 2006/0278833 A1 | 12/2006 | Van Herpen et al. | |

OTHER PUBLICATIONS

Sergiy Yulin et al., "High-temperature $MoSi_2/Si$ and Mo/C/Si/C multilayer mirrors", published in a poster session of the $3^{rd}$ International EUVL Symposium Nov. 1-4, 2004 Miyazaki, Japan.

* cited by examiner

*Primary Examiner*—Jack I Berman
*Assistant Examiner*—Hanway Chang
(74) *Attorney, Agent, or Firm*—Pillsbury Winthrop Shaw Pittman ILP

(57) ABSTRACT

An EUV illumination system, for example, for use in a photolithographic apparatus is configured to condition a radiation beam. A hydrogen radical source configured to supply gas containing hydrogen or hydrogen radicals into the illumination system. The hydrogen gas is effective to remove carbonaceous contamination from the surface of a mirror in the illumination system or to form a buffer against unwanted gases. In order to prevent damage by hydrogen that penetrates the mirror, the mirror comprises a layer made of metal non-metal compound adjacent a reflection surface of the mirror. A transition metal carbide, nitride, boride or silicide compound or mixture thereof may be used for example.

26 Claims, 8 Drawing Sheets

ILLUMINATION SYSTEM, LITHOGRAPHIC APPARATUS, MIRROR, METHOD OF REMOVING CONTAMINATION FROM A MIRROR AND DEVICE MANUFACTURING METHOD

FIELD

The present invention relates to an illumination system, to a lithographic apparatus comprising such an illumination system and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A photolithographic apparatus requires an illumination system that supplies a beam of radiation that is used to impart a pattern to the substrate. Of course, illumination systems for forming beams may also be used in applications other than photolithography where a beam or radiation is needed. An embodiment of such an illumination system contains mirrors to reflect the beam. In particular when an EUV beam is used mirrors are preferred over lenses. Preferably metal mirrors are used. Metal mirrors may be used that comprise a thick metal layer to reflect all of the radiation at a grazing angle of incidence, or alternatively mirrors may be used, comprising a stack alternating layers of metal and layers of non-metal. Metal mirrors with a thick metal layer are mostly used with a grazing incidence beam. Metal mirrors with a stacked structure are also used under other angles of incidence, even under (near) normal incidence conditions. Typical metals used in such mirrors are Molybdenum and Ruthenium. In the stacked structures the layers between metal layers are often made of silicon.

However, the use of such mirrors has its problems. Molybdenum and Silicon are susceptible to oxidation when exposed at the surface. Therefore mirrors containing layers of these materials are often provided with a top layer, which protects against oxidation (for example ruthenium may be used for this).

Also the mirrors tend to get contaminated during use. From US patent application publication No 20060278833, assigned to the same assignee, it is known that use of a gas containing hydrogen (in particular hydrogen radicals) can be used to remove contamination from an optically reflective surface in a EUV lithographic apparatus. It has been found that Sn and C contamination can be effectively removed from reflective surfaces in this way.

Unfortunately atomic hydrogen can also cause cracks in the reflective surface when the mirror has a layer of certain metals, such as an exposed ruthenium or molybdenum layer, that can be reached by the hydrogen radical. This effect has been described in a US patent application assigned to the assignee of the present application (assignee docket P 2263.000). In this patent application it was described that a coating of $Si_3N_4$ can be used to protect against cracking. However, such a coating detracts from reflection and may be difficult to deposit for certain mirror configurations An EUV mirror containing a stack of layers of alternately Si and MoSi2 is known from an article titled "High-temperature MoSi2/Si and Mo/C/Si/C multilayer mirrors High-temperature MoSi2/Si and Mo/C/Si/C multilayer mirrors", published in a poster session of the 3rd International EUVL Symposium 01-04 November 2004 Miyazaki, Japan. This reference is limited to multilayer mirrors and it does not mention hydrogen cleaning. Moreover a MoSi2/Si mirror has a relatively low peak reflection (approx. 40%) at 1.5 degrees to the perpendicular.

SUMMARY

It is desirable to provide for an illumination system wherein a reflective surface that is protected from cracking with a minimum detrimental effect on reflectivity.

According to an aspect of the invention, there is provided an illumination system configured to condition a radiation beam, comprising a mirror comprising a layer made of metal non-metal compound adjacent a reflection surface of the mirror and a hydrogen radical source configured to supply gas containing hydrogen or hydrogen radicals to the reflection surface. According to another aspect of the invention, there is provided a radiation source comprising such an illumination system.

According to an aspect of the invention, there is provided a lithographic apparatus comprising an illumination system configured to condition a radiation beam and a hydrogen radical source configured to supply gas containing hydrogen or hydrogen radicals into the illumination system, the illumination system comprising a mirror comprising a layer made of metal non-metal compound adjacent a reflection surface of the mirror.

According to an aspect of the invention, there is provided a mirror for use in a hydrogen or hydrogen radical environment, comprising a protection layer made of a metal non-metal compound adjacent a reflection surface of the mirror.

According to an aspect of the invention, there is provided a method of removing contamination from a mirror with a reflecting metal containing layer, the method comprising supplying a hydrogen radicals to a reflection surface of the mirror and protecting the mirror against damage due to the supply of the hydrogen radicals by using a layer made of a metal non-metal compound in the mirror adjacent the reflection surface.

According to an aspect of the invention, there is provided a device manufacturing method comprising projecting a patterned beam of radiation onto a substrate, wherein the radiation that goes into the beam is reflected by a mirror, the method comprising a step of removing contamination from a mirror using a supply of a gas containing hydrogen radicals to a reflection surface of the mirror, wherein the mirror comprises a layer made of a metal non-metal compound adjacent the reflection surface.

According to an aspect of the invention, there is provided a EUV mirror comprising a protection layer made of a metal non-metal compound adjacent a reflection surface of the mirror.

According to an aspect of the invention, there is provided a method of removing contamination from a mirror with a reflecting metal containing layer, the method comprising supplying a hydrogen radicals to a reflection surface of the mirror and protecting the mirror against damage due to the supply of the hydrogen radicals by using a layer made of a metal non-metal compound in the mirror adjacent the reflection surface.

According to an aspect of the invention, there is provided a device manufacturing method comprising projecting a patterned beam of radiation onto a substrate, wherein the radiation that goes into the beam is reflected by a mirror, the method comprising a step of removing contamination from a mirror using a supply of a gas containing hydrogen radicals to a reflection surface of the mirror, wherein the mirror comprises a layer made of a metal non-metal compound adjacent the reflection surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
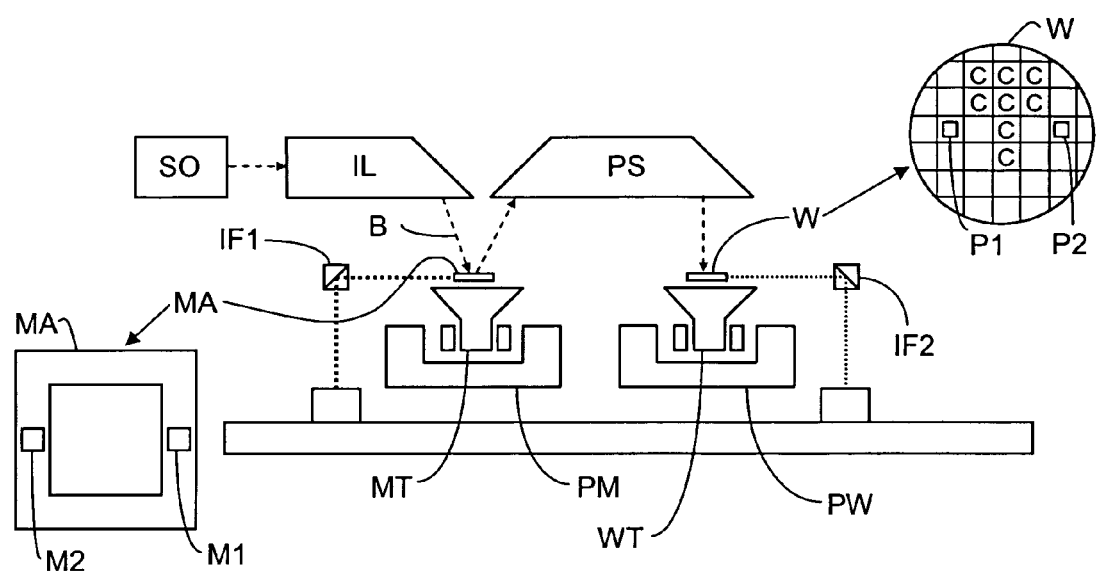
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
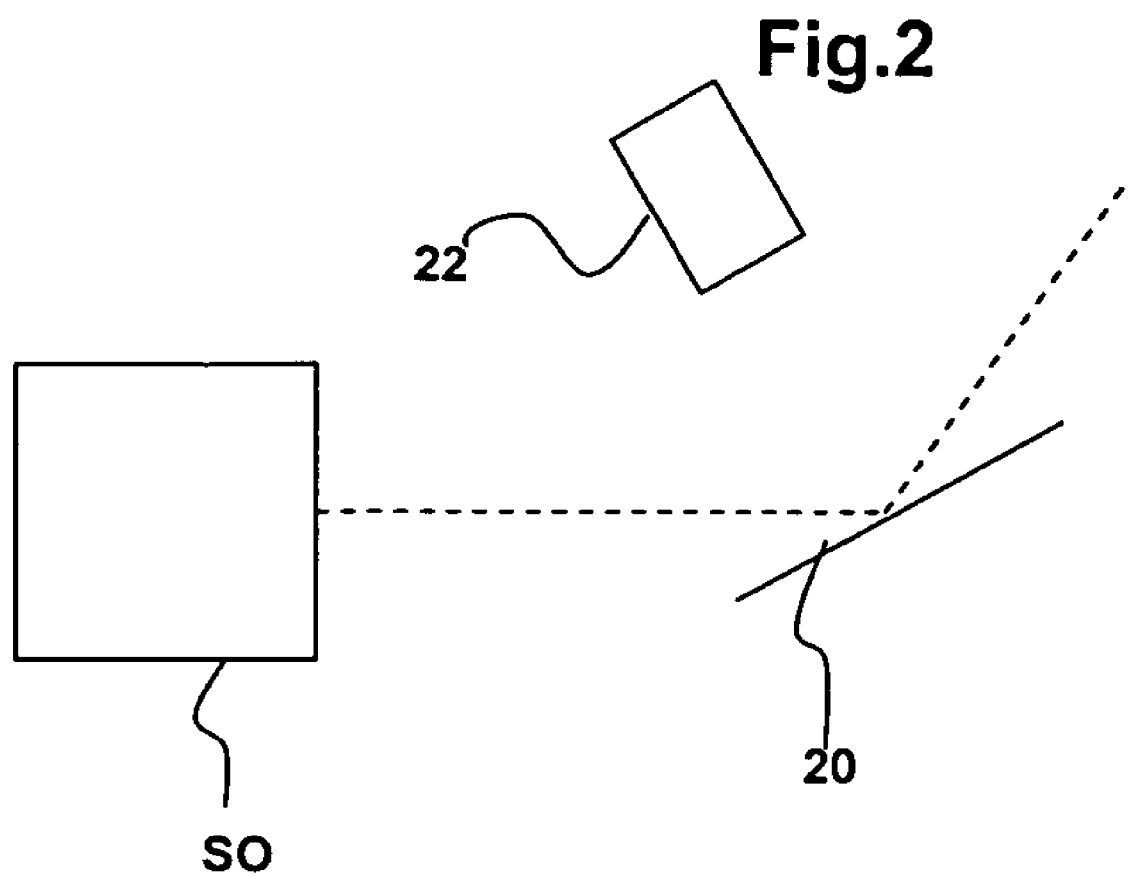
FIG. 2 depicts a part of a lithographic apparatus.

Combinations and/or variations on the above described modes of use or entirely different modes of use may also be employed FIG. 2 schematically shows source SO and part of an illumination system, including a mirror 20. Although an embodiment is shown wherein the illumination system and the source are separate units, it should be appreciated that in another embodiment the source may be part of the illumination system, in a single apparatus, which may be a lithographic apparatus or an apparatus for another application. The mirror 20 may be configured for grazing incidence or normal-incidence reflection. In an embodiment mirror 20 is the first mirror encountered along a radiation path from source SO to the substrate (not shown), i.e. the mirror that is exposed to most radiation and particles from radiation source SO. Furthermore the lithographic apparatus comprises a hydrogen radical source 22 configured to supply hydrogen radicals (atomic hydrogen) to the surface of mirror 20 for cleaning purposes. In an embodiment the source SO is a plasma source, which is known per se. One reason for using a plasma source is that it is suitable for producing very short wavelength radiation of use in the beam, e.g. in the EUV range.

Mirror 20 EUV mirror, which means that it has reflectivity to reflect a sufficient part of the EUV beam to be useful for photolithography. Conventionally, mirror 20 (and other mirrors not shown) which function as EUV mirrors in the lithographic apparatus can be made of, metals like Molybdenum or Ruthenium (for example a grazing incidence beam is used) or mirror 20 may comprise a plurality of layers in a stack of alternate layers of different materials. Metals like Mo and Ru provide for efficient reflection of radiation in the EUV range. As used herein such metal layers will be termed reflecting metal layers, both when a single such layer provides for substantially all reflection on its own and when reflections is provided by a stack containing such metal layers.

Unfortunately the use of EUV radiation has the effect that such a mirror 20 in the lithographic apparatus (and other mirrors, not shown, elsewhere in the apparatus) can become contaminated by carbonaceous deposits. Moreover, certain suitable plasma sources SO produce Sn ions which can also lead to contamination of the mirrors.

Hydrogen radical source 22 is provided to remove this type of contamination. During a cleaning step hydrogen radical source 22 supplies atomic hydrogen to mirror 20 (and optionally to other mirrors not shown). In an embodiment a stream of hydrogen radicals is supplied in situ in the apparatus during the cleaning step, for example between two successive pattern projection operations. Alternatively, the hydrogen radicals may even be supplied during projection. As an alternative the mirror may be removed or replaced to perform cleaning.

Unfortunately, it has been found that with conventional metal mirrors exposure of the mirror to hydrogen radicals leads to damage to the mirror. Such exposure may arise during cleaning, but also when traces of hydrogen gas are present during irradiation with an EUV beam, because the beam can dissociate hydrogen.

In another embodiment a hydrogen source is present in the photolithographic apparatus to create a buffer gas to suppress effects of ions introduced into the photolithographic apparatus, for example by a plasma radiation source, or to create a gas curtain against gasses emerging from photoresist on substrate W. During exposure to a EUV beam of radiation, the beam may dissociate hydrogen molecules into radicals, which give rise to similar problems as the hydrogen radicals supplied by hydrogen radical source 22. Hence, when a hydrogen source is present in the photolithographic apparatus, these problems may occur whether a hydrogen radical source is present or not.

Figure 3:
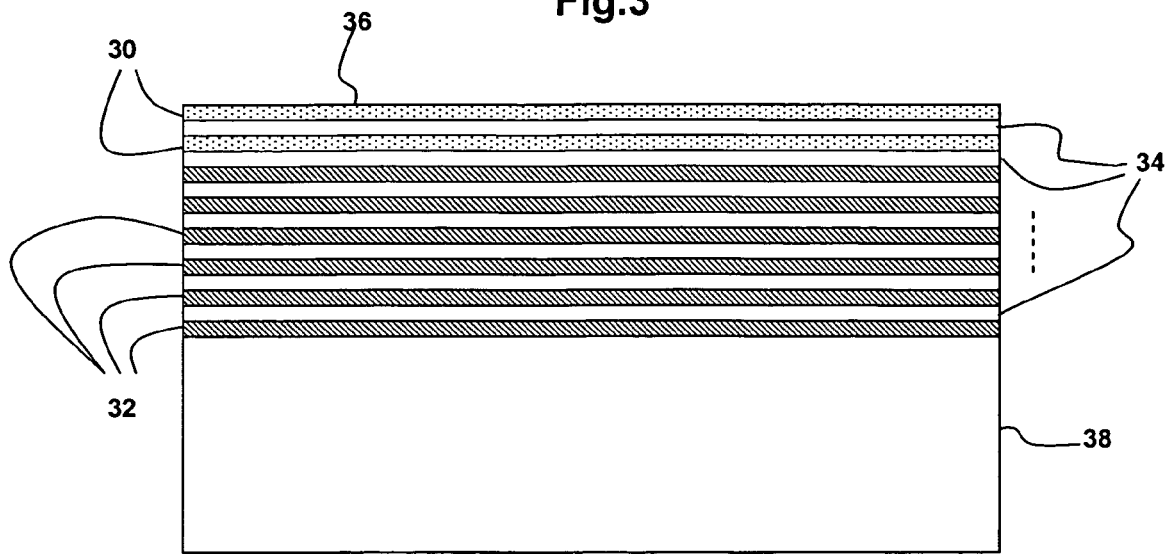
FIGS. 3-7 depict cross sections of embodiments of a mirror.

FIG. 3 shows an embodiment of mirror 20 in cross section. Mirror 20 is specifically designed for use in a photolithographic apparatus that contains a hydrogen source and/or a hydrogen radical source, but such a mirror may also be used in other contexts. Mirror 20 comprises a stack of layers of alternating mutually different materials on a substrate 38. A stack is typically used to make it possible to reflect EUV beams at (near) normal incidence on the surface of the mirror. The stack comprises first layers 30 made of for example $Mo_2Si$ (i.e Mo and Si in a ratio of two to one), which function as protection layers, second layers 32 made of for example substantially pure Mo and third layers 34 made of, for example, substantially pure Si. As used herein "substantially pure" includes purity levels as can be obtained by sputtering from a Mo or Si target, and at least so pure that the Mo properties with respect to hydrogen radicals are not significantly affected by any impurities. The first layers 30 are closer to the reflection surface 36 of mirror 20 than second layers 32. Third layers 34 are provided between successive first and second layers 30, 32.

Second and third layers 32, 34 form an EUV reflective multilayer stack. Without protection layers of $Mo_2Si$ such stacks are known per se. The thickness of the layers is selected in order to provide for constructive interference of reflected radiation when mirror 20 is used. First layers 30 may have thickness in a range of 0.5 to 5 nm, for example. First layers 30 made of $Mo_2Si$ are added to protect mirror 20 against cracking effects due to hydrogen radicals.

Figure 4:
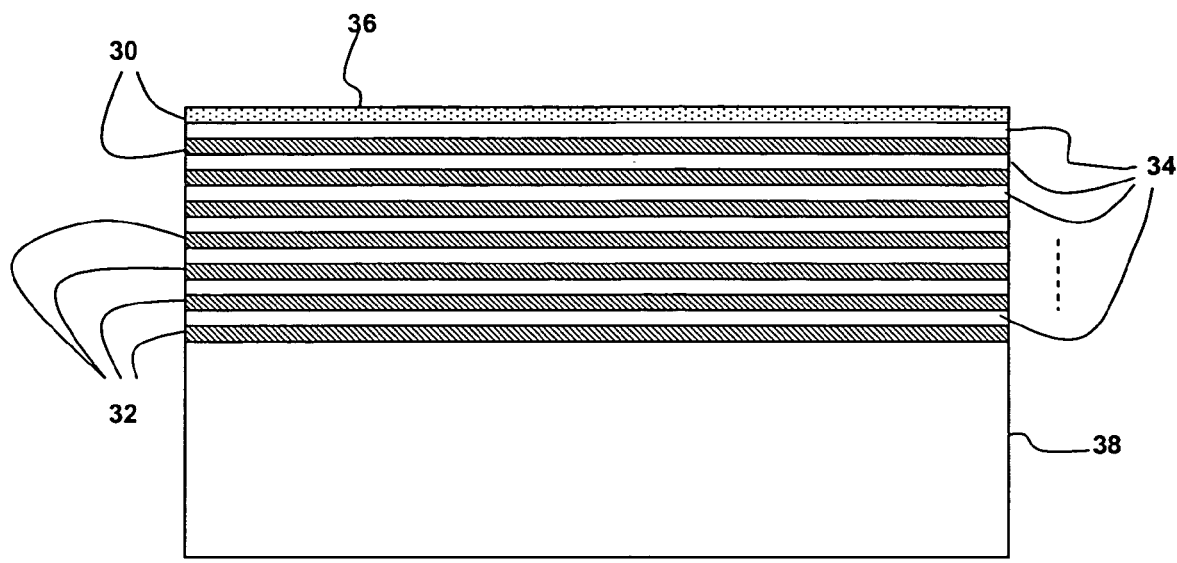
Figure 5:
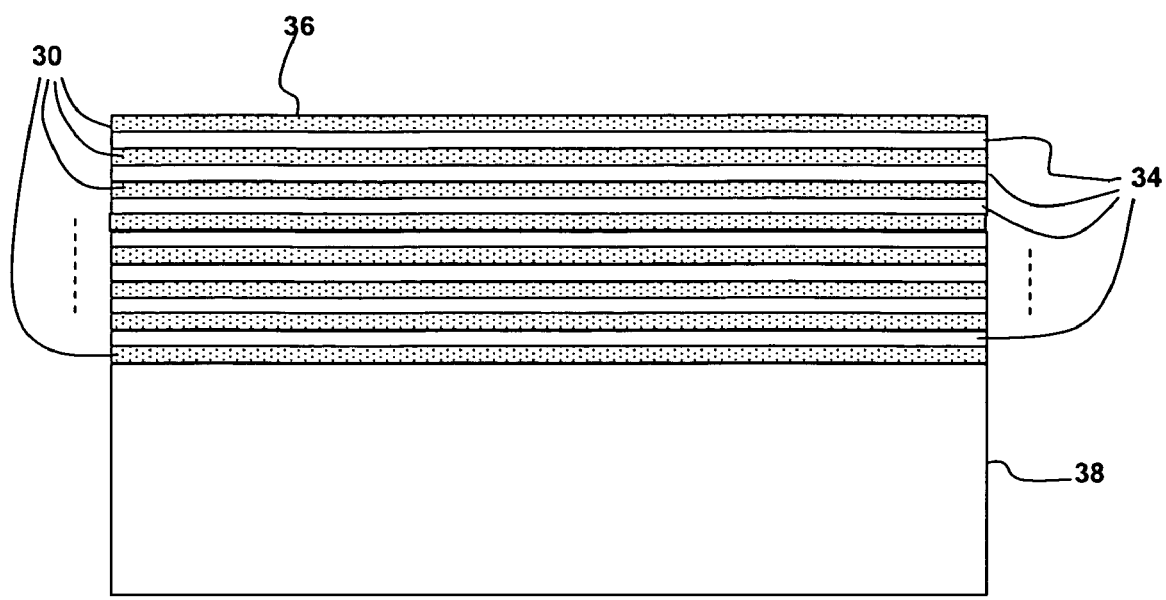

Although an embodiment has been shown with two first layers 30 of $Mo_2Si$ and a larger number of second layers 32 in the multilayer stack, it should be appreciated that a different number of first layers 30 of $Mo_2Si$ may be used, for example only one first layer of $Mo_2Si$ nearest reflection surface 36, followed by layers of Mo, with third layers 34 in between (as shown in FIG. 4), or three or more layers of $Mo_2Si$ nearest reflection surface 36, followed by layers of Mo. In a further embodiment (FIG. 5) no layers of Mo may be used at all, alternate layers of $Mo_2Si$ and Si being used. However, it is preferred that the ratio between the number of layers of $Mo_2Si$ and the number of layers of Mo is less than 50% and preferably less than 10%. Thus the reducing effect of the lower reflectivity of $Mo_2Si$ is minimized.

Figure 6:
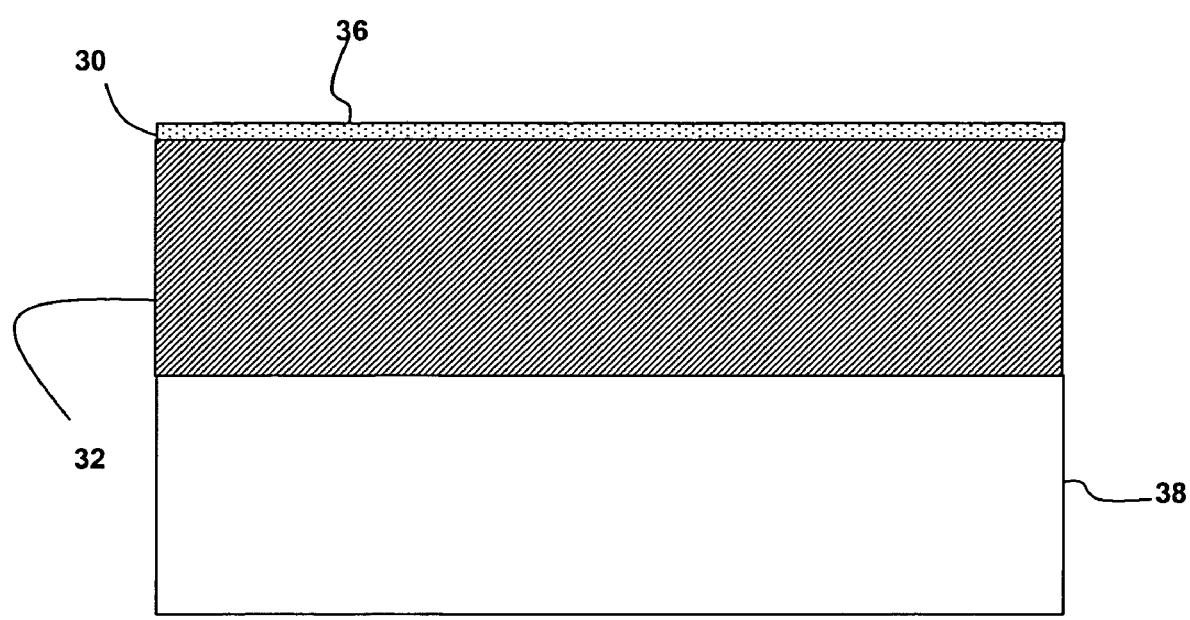
Figure 7:
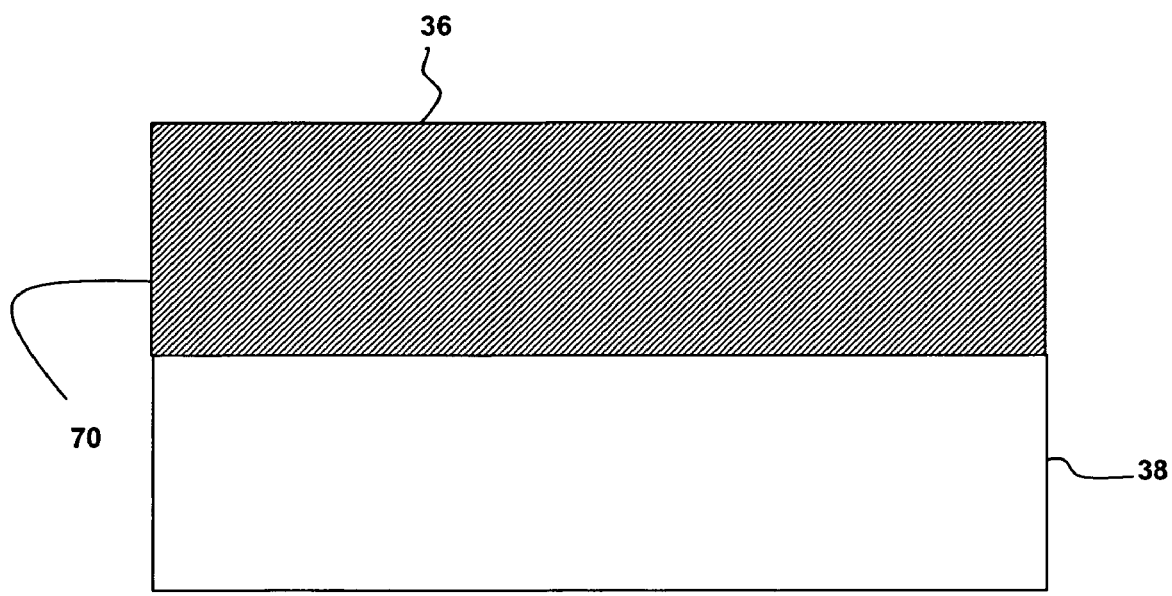

In another embodiment, shown in FIG. 7 reflection is provided substantially entirely (e.g. by more than 90%) by a single, thick protection layer of $Mo_2Si$ (i.e. much thicker than the layer thickness used for obtaining interference), or another compound of a metal and Si. Typically, at EUV wavelengths such a mirror is used for grazing incidence reflection, at an angle of, say, five degrees with the surface. As used herein "protection layer" refers to a layer between the reflection surface of the mirror and one or more layers of a different material that is vulnerable to damage by hydrogen (or hydrogen radicals), such as shown in FIG. 3, but in the case of mirror with only a single layer next to the reflection surface to provide all reflectivity the term "protection layer" refers to that single layer, as shown in FIG. 6, because this protects vulnerable layers by making them redundant.

FIG. 6 shows or by a single layer of a metal that provides substantially for all reflection (e.g. >90%) capped by a protection layer of a compound of a metal and Si as shown. Typically, at EUV wavelengths such a mirror is used for grazing incidence reflection, at an angle of, say, five degrees with the surface. A protection layer of at least 2 nm thickness may be used for protecting the underlying substrate in this embodiment, but preferably a thickness of at least 12 nm is used to achieve high reflectivity. There is no limit on the maximum thickness of the mirror, a thickness of >1 micrometer may be used, as long as the surface roughness is still acceptable (<1 nm for EUV radiation). Note that it is also possible to use a layer 32 made of a metal Si compound in combination with an additional thin protective layer of another material, such as Si3N4 between the metal-Si compound layer and the reflection surface. In this case the thin protective layer with a low thickness (~2 nm) may be used, for example to increase performance of the hydrogen cleaning technique. Previously, it has been shown that for example a thin coating of Si3N4 can significantly increase the Sn cleaning rate from a Ru surface. It is expected to be similar when a Ru/Si compound is used instead of Si3N4.

As shown in the preceding figures a protection layer of $Mo_2Si$ is used to protect against detrimental effects of hydrogen cleaning. This protection layer may be a first layer on top of a stack of alternating layers, a layer on to top of a layer with a thickness to provide all reflectively of the mirror on its own, or the protective layer itself may have a thickness to provide all reflectively of the mirror on its own. The layer is a compound of Mo and Si. As used herein the term "metal non-metal compound" is used to signify that Mo and Si (or any other combination of a metal and a non-metal) are mixed at an atomic level, i.e. so that the layer is not made up of separate crystals of Mo and Si, or separate sub-layers that each contain only one of these materials, for example by simultaneous sputtering from Mo and Si targets or by growing from $Mo_2Si$ molecules. As used herein, the term "metal non-metal compound" encompasses such mixtures at atomic level in all concentration ratios, not necessarily limited to stoichiometric ratios.

It has been found that $Mo_2Si$ combines the properties of good EUV reflectivity and reduced susceptibility to cracking when exposed to hydrogen radicals. The reflectivity of $Mo_2Si$ is about 95.3% at 5 degrees grazing incidence, which is only slightly worse than the reflectivity of Mo under the same conditions (96.3%). A possible explanation is that Mo is a metal with high atomic weight, which provides for good EUV reflectivity, whereas the presence of Si in the lattice reduces or blocks migration of hydrogen atoms through the $Mo_2Si$ lattice. Migration through metal-only lattices is assumed to contribute to the cracking effect of cleaning with hydrogen radicals.

In an embodiment mirror 20 is manufactured using sputtering to deposit the layers. When the protection layer (or one of the protection layers) is deposited Mo and Si targets are activated concurrently so that Mo and Si are deposited in a ratio of 2:1 to form a lattice of $Mo_2Si$.

Although an embodiment using layers of Mo and $Mo_2Si$ has been shown, it should be appreciated that other materials may be used. In principle any metal may be used instead of Mo in the reflective layers, preferably transition metals are used. For example, instead of Mo another transition metal such as ruthenium (Ru), tungsten (W), Rhodium (Rh), Niobium (Nb) or Zirconium (Zr) may be used.

In the protection layers instead of $Mo_2Si$, one may use another compound of metal and non-metal, such as a transition metal carbide, nitride boride or silicide or mixtures thereof. Preferably, a combination of metal with silicon is used, as it has been found that this very effectively reduces problems due to hydrogen cleaning. Preferably a stoichiometric ratio of metal and Si. For example, it has been found that $Ru_2Si_3$ (Ru and Si in a ratio of two to three) may be used instead of $Mo_2Si$. $Ru_2Si_3$ has a reflectivity of 89.9% compared to Ru (94.8) at 5 degree grazing incidence. Damage due to cracking is also less when $Ru_2Si_3$ is used instead of Ru.

Figure 8:
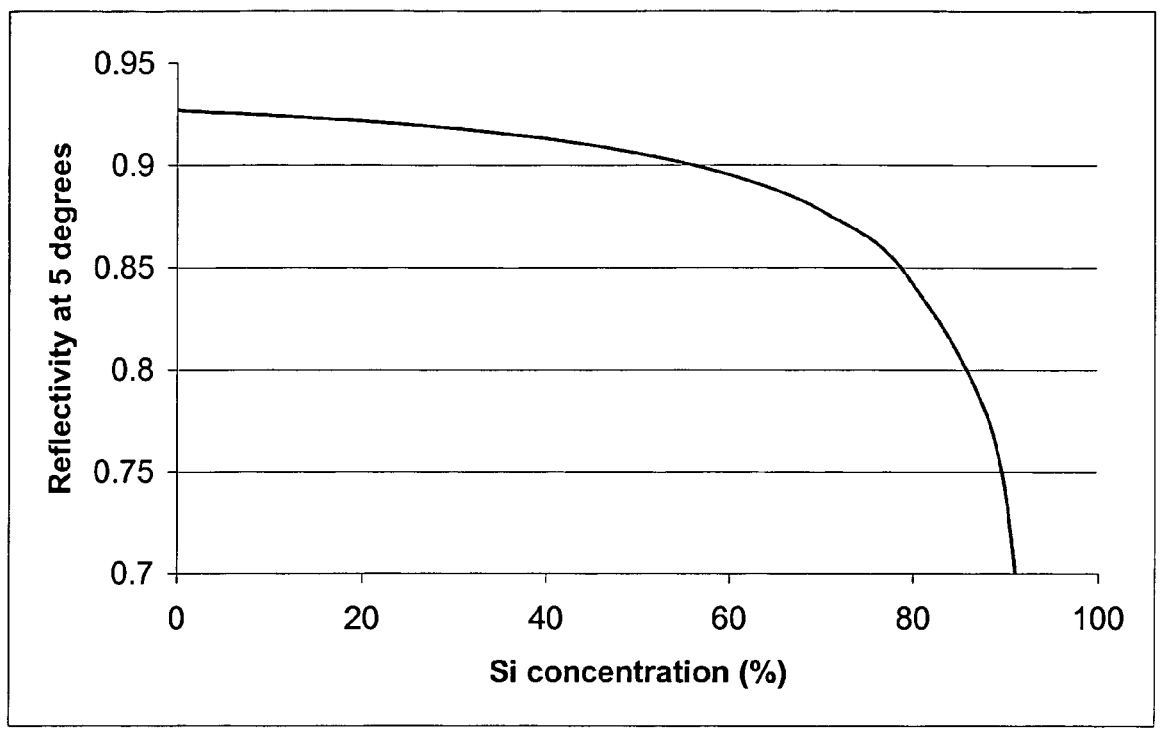
FIG. 8 depicts a theoretical relation between reflectivity and silicon content when Si is added to Ruthenium.

It may be noted that the proposed ratios are stoichiometric ratios, i.e. ratios that correspond to ratios of the metal and non-metal in molecules. This provides for a more stable compound layer with a well defined lattice. However, it may also be contemplated to use non-stoichiometric ratio's. In view of the dramatic reduction of the problems with hydrogen radical found in experiments with stoichiometric ratios it is expected that a significant reduction of these problems will also occur with other ratios, due to the fact that Si will also block hydrogen significant hydrogen uptake at such other ratio's. The main limitation on the amount of silicon is its effect on reflectivity. FIG. 8 shows a theoretical relation between reflectivity and silicon content when Si is added to Ruthenium (the stoichiometric ratio corresponds to 60%).

It can be seen that a Ru/Si compound will have a lower reflectivity compared to pure Ru surface. The difference depends on the reflection angle, but a typical reflection angle in practice is 7 degrees. When using a maximum allowed reflection loss of 10% compared to a normal Ru surface, the maximum allowed Si concentration is around 80%.

As can be seen, quite high silicon concentrations can be used with acceptable reflectivity. Thus, sufficient silicon can be provided to reduce the effect of hydrogen. Preferably at least 10% silicon is used. More preferably Si concentration of at least 30% is used.

As alternatives for Si, other materials may be added to the metal. The introduction of any non metal that can be combined with metal in the top layer before it is exposed to hydrogen is expected to reduce the effects of hydrogen. Be, BN, or $B_4C$ may be contemplated for example.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An illumination system configured to condition a radiation beam, comprising
   a mirror configured for grazing or normal incidence reflection comprising a stack of a plurality of alternating layers including a layer made of metal non-metal compound adjacent a reflection surface of the mirror with a non-metal layer between a substantially pure metal layer and the layer made of metal non-metal compound and
   a hydrogen radical source configured to supply gas containing hydrogen or hydrogen radicals to the reflection surface,
   wherein the layer made of metal non-metal compound to protect the substantially pure metal layer from the hydrogen or hydrogen radicals.

2. An illumination system according to claim 1, wherein the metal non-metal compound consists of a transition metal carbide, nitride, boride or silicide compound or mixture thereof.

3. An illumination system according to claim 1, wherein the metal non-metal compound is a metal silicon compound.

4. An illumination system according to claim 3, wherein the metal and silicon are present in the metal non-metal compound in a stoichiometric ratio.

5. An illumination system according to claim 1, wherein the metal in the metal non-metal compound is selected from the group of Mo and Ru.

6. An illumination system according to claim 5, wherein the metal non-metal compound is selected from the group consisting of Mo and Si in a ratio of two-to-one and Ru and Si in a ratio of two-to-three.

7. An illumination system according to claim 1, wherein the radiation beam is an EUV beam.

8. An illumination system according to claim 1, wherein the layer made of the metal non-metal compound being provided between said stack and the reflection surface.

9. An illumination system according to claim 8, wherein the stack comprises a plurality of substantially pure metal layers, alternating with non-metal layers.

10. An illumination system according to claim 8, wherein the stack of layers comprises only one layer of the metal compound.

11. An illumination system according to claim 1, wherein the layer made of the metal non-metal compound has a thickness sufficient to provide substantially all reflectivity of the mirror at an incidence angle at which the radiation beam is incident on the reflection surface.

12. An illumination system according to claim 1, wherein the layer made of the metal non-metal compound is provided between the reflection surface and a layer made of metal only and having a thickness sufficient to provide all substantially reflectivity of the mirror at an incidence angle at which the radiation beam is incident on the reflection surface.

13. A photolithographic apparatus comprising
an illumination system configured to condition a radiation beam and a hydrogen radical source configured to supply gas containing hydrogen or hydrogen radicals into the illumination system, the illumination system comprising
a mirror comprising one or more layers made of metal non-metal compound adjacent a reflection surface of the mirror with a non-metal layer between a substantially pure metal layer and the layer of metal non-metal compound, wherein the mirror includes one or more substantially pure metal layers such that a ratio between a number of the layers made of metal non-metal compound and a number of the metal layers is less than about 50%.

14. A photolithographic apparatus according to claim 13, wherein the metal non-metal compound consists of a transition metal carbide, nitride, boride or silicide compound or mixture thereof.

15. A photolithographic apparatus according to claim 13, wherein the metal non-metal compound is a metal silicon compound.

16. A photolithographic apparatus according to claim 15, wherein the metal and silicon are present in the metal non-metal compound in a stoichiometric ratio.

17. A photolithographic apparatus according to claim 13, wherein the metal in the metal non-metal compound is selected from the group of Mo and Ru.

18. A photolithographic apparatus according to claim 17, wherein the metal non-metal compound is selected from the group consisting of Mo and Si in a ratio of two to one and Ru and Si in a ratio of two to three.

19. A photolithographic apparatus according to claim 13, wherein the mirror comprises a stack of a plurality of alternating layers adjacent the reflection surface of the mirror, the one or more layers made of the metal non-metal compound being provided between said stack and the reflection surface.

20. A photolithographic apparatus according to claim 19, wherein the stack comprises a plurality of substantially pure metal layers, alternating with non-metal layers.

21. A photolithographic apparatus according to claim 19, wherein the stack of layers comprises only one layer of the metal compound.

22. A photolithographic apparatus according to claim 13, wherein a layer made of the metal non-metal compound of the one or more layers made of the metal non-metal compound has a thickness sufficient to provide substantially all reflectivity of the mirror at an incidence angle at which the radiation beam is incident on the reflection surface.

23. A photolithographic apparatus according to claim 13, wherein a layer made of the metal non-metal compound of the one or more layers made of the metal non-metal compound is provided between the reflection surface and a layer made of metal only and having a thickness sufficient to provide substantially all reflectivity of the mirror at an incidence angle at which the radiation beam is incident on the reflection surface.

24. A photolithographic apparatus according to claim 13, comprising a radiation source configured to emit radiation to the mirror.

25. A method of removing contamination from a mirror with a reflecting metal containing layer, the method comprising
supplying hydrogen radicals to a reflection surface of the mirror and
protecting the mirror against damage due to the supply of the hydrogen radicals by using one or more layers made of a metal non-metal compound in the mirror adjacent the reflection surface,
wherein the mirror includes one or more substantially pure metal layers with a non-metal layer between a substantially pure metal layer and the layer of metal non-metal compound, such that a ratio between a number of the layers made of metal non-metal compound and a number of the metal layers is less than about 50%.

26. A device manufacturing method comprising
projecting a patterned beam of radiation onto a substrate, wherein the radiation that goes into the beam is reflected by a mirror, the method comprising a step of
removing contamination from a mirror using a supply of a gas containing hydrogen radicals to a reflection surface of the mirror,
wherein the mirror comprises one or more layers made of a metal non-metal compound adjacent the reflection surface,
wherein the mirror includes one ore more substantially pure metal layers with a non-metal layer between a substantially pure metal layer and the layer of metal non-metal compound, such that a ratio between a number of the layers made of metal non-metal compound and a number of the metal layers is less than about 50%.

* * * * *